(12) United States Patent
Corbin

(10) Patent No.: US 7,395,465 B2
(45) Date of Patent: Jul. 1, 2008

(54) MEMORY ARRAY REPAIR WHERE REPAIR LOGIC CANNOT OPERATE AT SAME OPERATING CONDITION AS ARRAY

(75) Inventor: William R. J. Corbin, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/275,540

(22) Filed: Jan. 13, 2006

(65) Prior Publication Data

US 2006/0101305 A1 May 11, 2006

(51) Int. Cl.
*G11C 29/00* (2006.01)
(52) U.S. Cl. .................. 714/718; 714/710; 714/711
(58) Field of Classification Search .......... 714/710, 714/711, 718
See application file for complete search history.

(56) References Cited

U.S. PATENT DOCUMENTS

| 5,588,115 | A | 12/1996 | Augarten |
| 5,754,556 | A | 5/1998 | Ramseyer et al. |
| 6,085,334 | A * | 7/2000 | Giles et al. ............ 714/7 |
| 6,421,286 | B1 | 7/2002 | Ohtani et al. |
| 6,442,724 | B1 | 8/2002 | Augarten |
| 6,536,005 | B1 | 3/2003 | Augarten |
| 6,661,718 | B2 | 12/2003 | Ohlhoff et al. |
| 6,856,569 | B2 | 2/2005 | Nelson et al. |
| 7,260,758 | B1 * | 8/2007 | Agrawal et al. ......... 714/733 |
| 2005/0047229 | A1 | 3/2005 | Nedeau-Doslie et al. |
| 2005/0120270 | A1 | 6/2005 | Anand et al. |

* cited by examiner

*Primary Examiner*—Jacques Louis-Jacques
*Assistant Examiner*—John J Tabone, Jr.
(74) *Attorney, Agent, or Firm*—Anthony J. Canale; Hoffman, Warnick & D'Alessandro LLC

(57) ABSTRACT

Memory array repair where the repair logic cannot operate at the same operating condition as the memory array is presented. In one embodiment, a test is run with the memory array configured in a first operating condition that repair logic for the memory array cannot achieve, and test data is accumulated from the test in the memory array. The memory array is then read with the memory array configured in a second operating condition that the repair logic can achieve using the test data from the test at the first operating condition. As a result, repairs can be achieved even though the repair logic is incapable of operating at the same condition as the memory array. A method, test unit and integrated circuit implementing the testing are presented.

6 Claims, 3 Drawing Sheets

MEMORY ARRAY REPAIR WHERE REPAIR LOGIC CANNOT OPERATE AT SAME OPERATING CONDITION AS ARRAY

BACKGROUND OF THE INVENTION

1. Technical Field

The invention relates generally to memory array analysis, and more particularly, to a memory array repair where repair logic cannot operate at the same operating condition as the memory array.

2. Background Art

Testing and repair of memory arrays prior to release to a customer is a common practice during integrated circuit (IC) and/or memory array fabrication. For example, ICs oftentimes include embedded memory arrays such as an embedded dynamic random access memory (DRAM) array, which requires testing and repair. These embedded memory arrays are analyzed by the fabricator using a built-in-self-test (BIST) unit that is included on the IC or using separate, stand alone testing units.

One challenge during testing is addressing situations where the memory array can operate at an operating condition that the repair logic, used to evaluate and repair the embedded memory array, cannot achieve. Repair logic may be any system, such as a redundancy analyzer, used to capture memory cell failures and repair and/or replace memory cell assignments to ensure proper operation of the embedded memory. For example, one operating condition at which a memory array may operate and the repair logic may not be able to achieve is a higher speed. For example, a memory array may run at, for example, 500 MHz, while the repair logic may only be able to run at, for example, 100-200 MHz. In this case, when the test unit runs with the memory array configured for the higher speed, i.e., 500 MHz, it is impossible for the repair logic to repair all faults at the higher speed. Another operating condition at which a memory array may operate and the repair logic may not be able to achieve is a higher latency. For example, a discrete DRAM array may have different amounts of latency. For instance, a conventional discrete DRAM array may have a 20 ns latency, i.e., 50 MHz, which is allowed to be broken into 4 separate clocks of 5 ns each, so that the memory array operates at 200 MHz. That is, once testing is started, data can be acquired every 5 ns, just not from the same address. Repair logic, however, is typically not sophisticated enough to handle latency with 4 clocks. In this case, an address input to the DRAM array during testing will be read out in such a way that it is always off by some parameter, e.g., a number of addresses. That is, the data read out of the memory array by the repair logic is always late by 3-4 cycles such that the address that exists in the repair logic is continuously trailing the memory array. As a result, the repair logic places repair data in the wrong DRAM array address, and proper repair cannot be achieved.

The above-described situation is especially problematic where repair logic is embedded with the memory array because it is generally impracticable to provide repair logic that operates at all of the operating conditions, e.g., higher speed, lower latency, etc., that the memory array can achieve because it uses up too much valuable silicon space. It also should be understood that this situation occurs for all types of memory arrays, embedded or discrete, and for BIST units and stand alone test units.

There is a need in the art for a way to repair a memory array where the repair logic is incapable of operating at the same condition as the memory array.

SUMMARY OF THE INVENTION

Memory array repair where the repair logic cannot operate at the same operating condition as the memory array is disclosed. In one embodiment, a test is run with the memory array configured in a first operating condition that repair logic for the memory array cannot achieve, and test data is accumulated from the test in the memory array. The memory array is then read with the memory array configured in a second operating condition that the repair logic can achieve using the test data from the test at the first operating condition. As a result, repairs can be achieved even though the repair logic is incapable of operating at the same condition as the memory array. A method, test unit and integrated circuit implementing the testing are disclosed.

A first aspect of the invention provides a method of testing a memory array, the method comprising the steps of: running a test with the memory array configured in a first operating condition that a repair logic for the memory array cannot achieve, and accumulating test data from the test in the memory array; reading the test data from the memory array with the memory array configured in a second operating condition that the repair logic can achieve; and repairing the memory array using the repair logic and the test data.

A second aspect of the invention provides a test unit for a memory array including repair logic, the test unit comprising: a tester for testing the memory array configured in a first operating condition that the repair logic cannot achieve, and accumulating test data from the tester in the memory array; and a controller for allowing the repair logic to read and repair the memory array with the memory array configured in a second operating condition that the repair logic can achieve using the test data created by the test at the first operating condition.

A third aspect of the invention provides an integrated circuit including an embedded memory array including repair logic for the embedded memory array, the integrated circuit comprising: a built-in-self-test (BIST) unit for the embedded memory array, the BIST unit including: a tester for testing the memory array configured in a first operating condition that the repair logic cannot achieve, and accumulating test data from the test in the memory array; and a controller for allowing the repair logic to read and repair the memory array with the memory array configured in a second operating condition that the repair logic can achieve using the test data created by the tester at the first operating condition.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
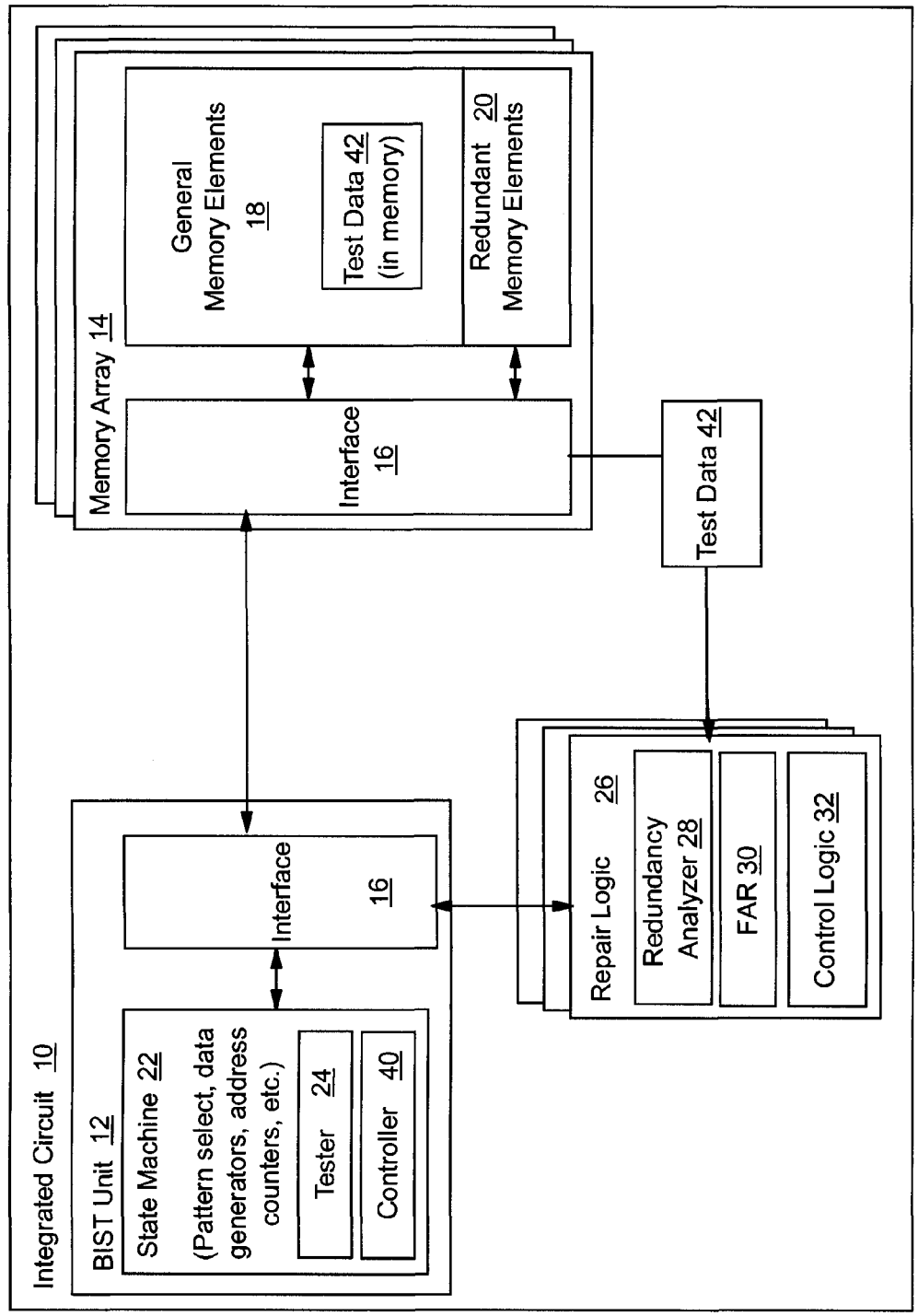
FIG. 1 shows a schematic diagram of one embodiment of a memory array repair structure according to the invention.
Figure 2:
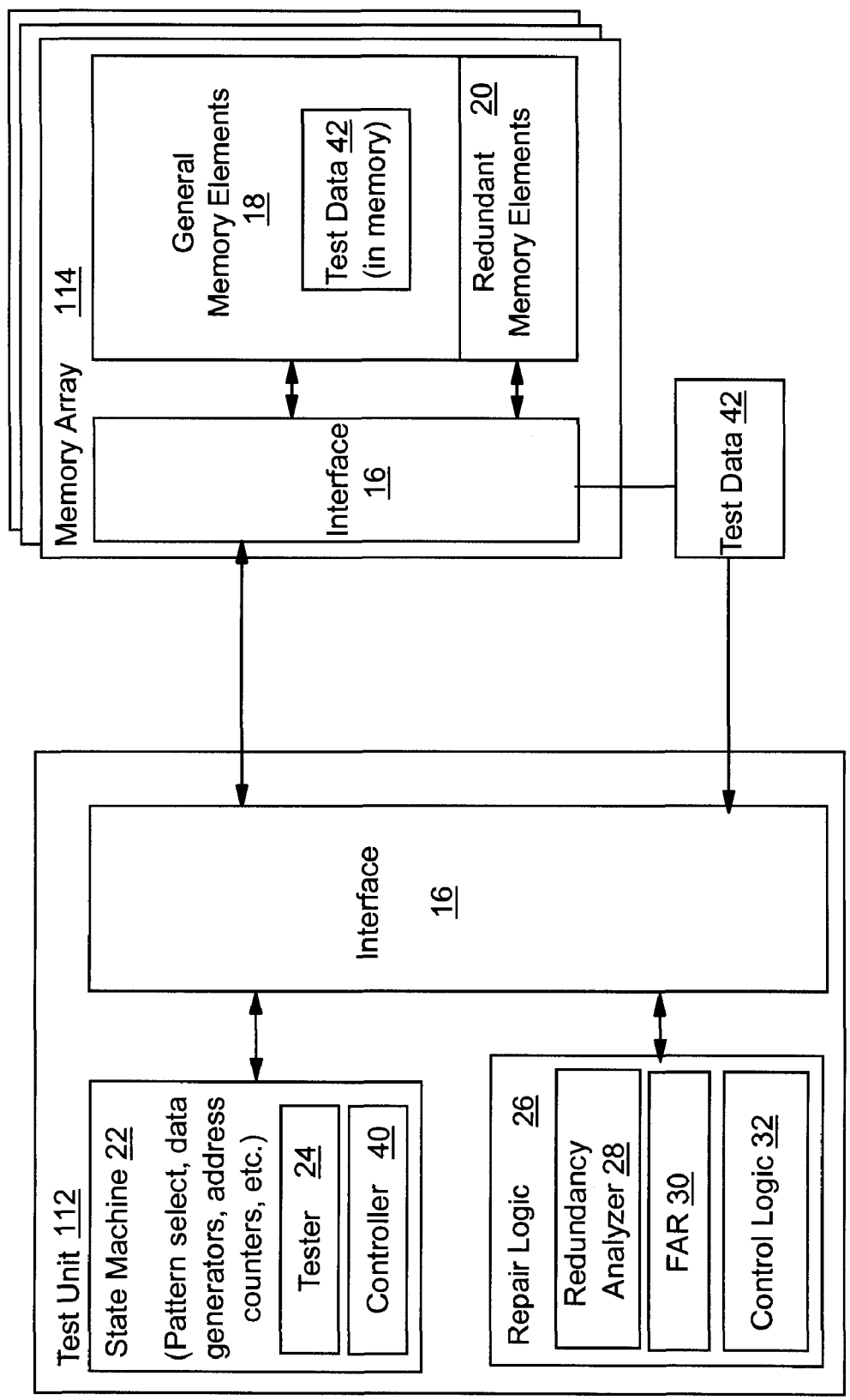
FIG. 2 shows a schematic diagram of another embodiment of a memory array repair structure according to the invention.

Referring to the drawings, FIG. 1 shows a schematic diagram of one embodiment of a memory array repair structure according to the invention. As shown in FIG. 1, in one embodiment, memory array repair according to the invention can be applied to an integrated circuit 10 (IC) including, inter alia, a built-in self test (BIST) unit 12 that is mated with one or more embedded memory arrays 14 along with each memory array's corresponding repair logic 26. It should be recognized that other physical layouts are also possible and considered within the scope of the invention. For example, FIG. 2 shows another embodiment in which memory array testing according to the invention is applied to a discrete memory array 114, separate from an IC 10 (FIG. 1), and a stand alone test unit 112 is used. As illustrated, repair logic 26 is part of test unit 112, however, this is not necessary. In addition, stand alone test unit 112 could be used with an embedded memory array 14 (FIG. 1) within an IC 10 (FIG. 1). Test unit 12, 112 and memory arrays 14, 114 each may include appropriate interfaces 16.

As used herein, "memory array" refers to any now known or later developed data storage device that functions like an electronic checkerboard, with each memory element holding one unit (e.g., one byte) of data or instruction, e.g., DRAM, static random access memory (SRAM), etc. Each memory element has a separate address and can be manipulated independently. Each memory array 14, 114 may include a specific design of a plurality of general memory elements 18 and a set of redundant memory elements 20. General memory elements 18 are initially intended for operation, and redundant memory elements 20 are provided to replace failing memory elements, general or redundant. "Replace" means a redundant memory element 20 is swapped for or exchanged for the failing memory element. Alternatively, each memory array 14, 114 may take the form of a compilable (or customizable) memory design in which the number of the plurality of memory elements 18 and the set of redundant memory elements 20 can be user selected.

Repair logic 26 may include any system, such as a redundancy analyzer 28, used to analyze memory element 18, 20 failures and repair and/or replace memory element 18, 20 assignments to ensure proper operation of memory array 14, 114. Repair logic 26 may also include a conventional set of failing address registers (FAR) 30 and other control logic 32. As shown in FIG. 2, repair logic 26 may be provided as part of stand alone test unit 112, or, as shown in FIG. 1, a group of memory arrays 14 may share a single repair logic 26. Alternatively, in FIG. 2, each memory array 114 may include corresponding repair logic 26. Although repair logic 26 is shown as a separate entity in FIG. 1, it should be recognized that repair logic 26 may be provided as part of a memory array 14.

BIST unit 12 and test unit 112 (collectively referred to hereafter as "test unit") each include, inter alia, a state machine 22 that includes, inter alia, a tester 24 and a controller 40. Collectively, tester 24 and controller 40 allow repair logic 26 of a respective memory array 14, 114 to analyze test data 42 created at an operating condition of the respective memory array 14, 114 that repair logic 26 cannot achieve. In particular, referring to first step S1 in FIG. 3, tester 24 tests memory array 14, 114 configured in a first operating condition that repair logic 26 cannot achieve, and accumulates test data 42 from the test, not in repair logic 26 as is conventional, but in memory array 14, 114. The "operating condition" can be any state of memory array 14, 114 at which repair logic 26 cannot achieve the same functioning. For example, the operating condition can include at least one of: a speed, a temperature, a voltage, an operation mode and a latency. Tester 24 implements a test of memory array 14, 114 at the first condition in which values are written to enable memory elements 18, 20 and then the test data 42 created by this first condition testing is stored in memory array 14, 114. Tester 24 may implement common test functions such as write pattern selects, data generators, address counters, etc., to carry out the test.

Figure 3:
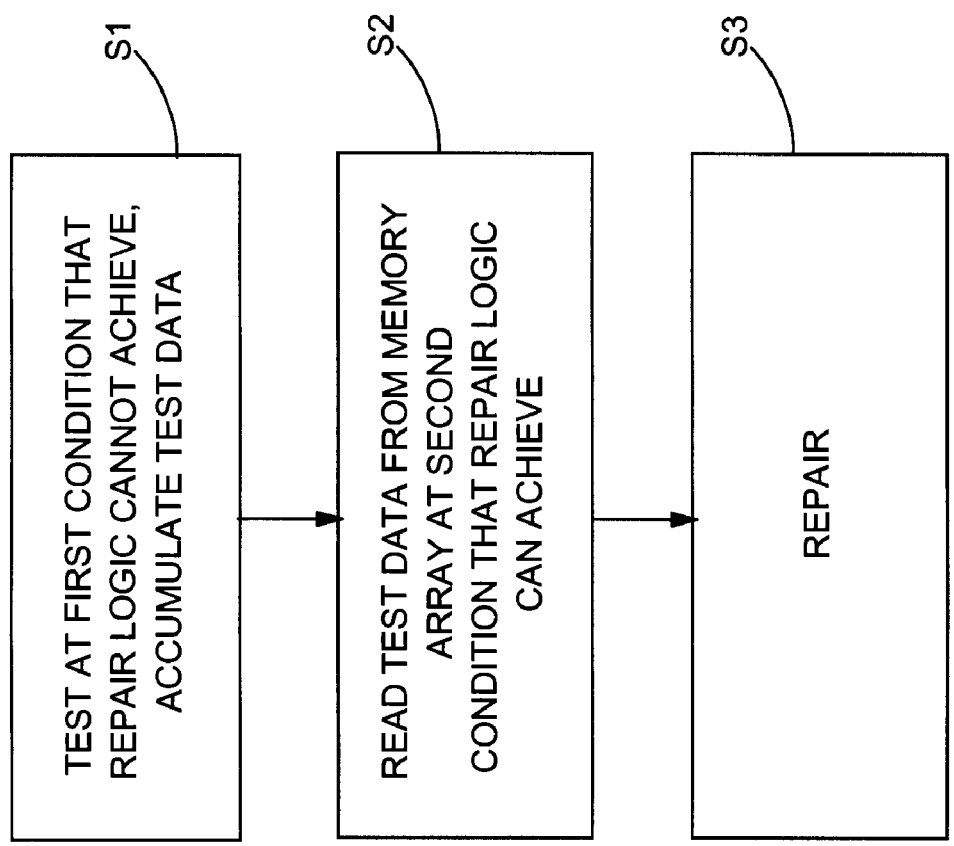
FIG. 3 shows a flow diagram of one embodiment of a memory array repairing according to the invention.

Next, as shown as step S2 in FIG. 3, controller 40 allows repair logic 26 to read test data 42 (created by the test at the first operating condition) from memory array 14, 114 with memory array 14, 114 configured in a second operating condition that repair logic 26 can achieve. In one embodiment, first and second operating conditions are the same type of condition, i.e., speed and speed, temperature and temperature, etc. However, this is not necessary. Next, as shown in step S3 of FIG. 3, controller 40 allows repair logic 26 to repair memory array 14, 114 using test data 42. For example, repair logic 26 may invoke redundancy analyzer 28 to determine whether a failure exists by comparing the test data 42 with the values written thereto by test unit 12, 112. If test data 42 and the value written do not match, a fail signal is activated (generated) by redundancy analyzer 28 and the failing memory element is replaced with a redundant memory element 20.

One operating condition for which the above-described embodiment can be employed is speed. For example, tester 24 may test memory array 14, 114 with the first operating condition being a higher speed than the second operating condition. In this example, tester 24 may configure memory array 14, 114 to operate at a speed of, for example, 500 MHz, and accumulate test data 42 in memory array 14, 114. Repair logic 26 may not be able to achieve the 500 MHz speed, so typically it would not be able to repair memory array 14, 114 at that speed without use of the invention. Controller 40 may then allow repair logic 26 to analyze memory array 14, 114 using test data 42 at the second operating condition of, for example, 100 MHz. In this fashion, repair logic 26 need not be modified to accommodate all of the different operating conditions of memory array 14, 114 and can analyze memory array 14, 114 at operating conditions that repair logic 26 cannot achieve. Where the test unit includes a BIST unit 12, it may be used during packaging and may be enabled in the function of the final product.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of testing a memory array, the method comprising the steps of:

running a test with the memory array configured in a first operating condition that a repair logic for the memory array cannot achieve, and accumulating test data from the test in the memory array;

reading the test data from the memory array with the memory array configured in a second operating condition that the repair logic can achieve; and repairing the memory array using the repair logic and the test data.

2. The method of claim 1, wherein the first and second operating conditions are the same type of condition.

3. The method of claim 1, wherein the repair logic includes a redundancy analyzer.

4. The method of claim 1, wherein the first and second operating conditions are each at least one of: a speed, a temperature, a voltage, an operation mode and a latency.

5. The method of claim 1, wherein the first and second operating conditions are speed, and the first operating condition has a higher speed than the second operating condition.

6. The method of claim 1, wherein the memory array is embedded in an integrated circuit (IC), and the running step includes running the test using a built-in-self-test unit in the IC.

* * * * *